(12) United States Patent
Mutoh

(10) Patent No.: US 7,527,915 B2
(45) Date of Patent: May 5, 2009

(54) FLAME RETARDANT MULTI-LAYER PHOTOIMAGABLE COVERLAY COMPOSITIONS AND METHODS RELATING THERETO

(75) Inventor: Tsutomu Mutoh, Utsunomiya (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 243 days.

(21) Appl. No.: 11/488,996

(22) Filed: Jul. 19, 2006

(65) Prior Publication Data

US 2008/0033090 A1 Feb. 7, 2008

(51) Int. Cl.
G03F 7/00 (2006.01)
G03F 7/004 (2006.01)

(52) U.S. Cl. .............. 430/273.1; 430/270.1; 430/280.1; 430/905; 430/913; 430/927

(58) Field of Classification Search .............. 430/273.1, 430/270.1
See application file for complete search history.

(56) References Cited

U.S. PATENT DOCUMENTS

| | | |
|---|---|---|
| 2,850,445 A | 9/1958 | Oster |
| 2,875,047 A | 2/1959 | Oster |
| 2,927,024 A | 3/1960 | Woodward et al. |
| 3,074,974 A | 1/1963 | Gebura |
| 3,097,096 A | 7/1963 | Oster |
| 3,097,097 A | 7/1963 | Oster et al. |
| 3,145,104 A | 8/1964 | Oster et al. |
| 3,380,831 A | 4/1968 | Cohen et al. |
| 3,427,161 A | 2/1969 | Leopold et al. |
| 3,479,185 A | 11/1969 | Crandall et al. |
| 3,549,367 A | 12/1970 | Chang et al. |
| 3,579,339 A | 5/1971 | Oster et al. |
| 3,622,334 A | 11/1971 | Matawan et al. |
| 3,645,772 A | 2/1972 | Jones |
| 3,754,920 A | 8/1973 | Kuchta |
| 3,778,270 A | 12/1973 | Roos |
| 3,784,557 A | 1/1974 | Cescon |
| 3,891,441 A | 6/1975 | Tsuji et al. |
| 4,064,287 A | 12/1977 | Lipson et al. |
| 4,071,367 A | 1/1978 | Collier et al. |
| 4,127,436 A | 11/1978 | Friel |
| 4,168,982 A | 9/1979 | Pazos |
| 4,198,242 A | 4/1980 | Pazos |
| 4,230,793 A | 10/1980 | Losert |
| 4,293,635 A | 10/1981 | Flint et al. |
| 4,311,783 A | 1/1982 | Dessauer |
| 4,341,860 A | 7/1982 | Sysak |
| 4,376,815 A | 3/1983 | Oddi et al. |
| 4,438,189 A | 3/1984 | Geissler et al. |
| 4,477,556 A | 10/1984 | Dueber et al. |
| 4,485,166 A | 11/1984 | Herwig et al. |
| 4,621,043 A | 11/1986 | Gervay |
| 4,622,286 A | 11/1986 | Sheets |
| 4,772,541 A | 9/1988 | Gottschalk et al. |
| 4,920,038 A * | 4/1990 | Budde et al. ............. 430/315 |
| 5,536,620 A * | 7/1996 | Dueber et al. ............ 430/284.1 |

FOREIGN PATENT DOCUMENTS

JP 11189713 A * 7/1999

OTHER PUBLICATIONS

English language machine translation of JP 2004-157188.*
J. Kosar, Light Sensitive Systems: Chemistry and Application of Nonsilver Halide Photographic Processes, 1965, John Wiley & Sons (Book Not Included).
J. Sturge et. al., Imaging Processes and Materials, 1989. Neblette's Eighth Edition (Book Not Included).
A.B. Cohen et. al., Imaging Processes and Materials, Polymer Imaging, pp. 226-262, Chapter 7.
R. Dessauer et. al., Low Amplification Imaging Systems, Imaging Processes and Materials, pp. 263-278, Chapter 8.
D.F. Eaton, Dye Sensitized Photopolymerization, Adv. in Photochemistry, 1986, vol. 13:427-487.

* cited by examiner

*Primary Examiner*—Amanda C. Walke

(57) ABSTRACT

The present invention is directed to phosphorus containing (or "halogen free") multi-layer flame retardant photoimagable compositions useful as a coverlay material in a flexible electronic circuitry package. These compositions generally contain a top layer and bottom layer adjacent to one another both being photosensitive and comprising phosphorus containing acrylates and phosphorus-containing photo-initiators mixed with a polymer binder. These compositions typically have phosphorus in the top layer in an amount between, and including, any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8, 6.0, 6.2, 6.4, 6.6, 6.8, 7.0, 7.2, 7.4, 7.6, 7.8, 8.0, 8.2, 8.4, 8.6, 8.8, 9.0, 9.2, 9.4, 9.6, 9.8, and 10.0 weight percent, and have phosphorus in the bottom layer in an amount between, and including, any two of the following numbers, 0.0, 0.2, 0.4, 0.6, 0.8, 1.0, 1.2, 1.4, 1.6, 1.8, 2.0, 2.2, 2.4, 2.6, 2.8, 3.0, 3.2, 3.4, 3.6, 3.8, and 4.0 weight percent.

4 Claims, No Drawings

FLAME RETARDANT MULTI-LAYER PHOTOIMAGABLE COVERLAY COMPOSITIONS AND METHODS RELATING THERETO

BACKGROUND INFORMATION

1. Field of the Disclosure

The present invention relates generally to flame retardant electronic circuitry packaging. More specifically, the methods and compositions of the present invention are directed to flexible, aqueous-processible, photoimagable, multi-layer coverlay compositions having little, if any, halogen (compared to conventional flame retardant coverlays), due at least in part to the use of a phosphorus based chemistry in at least one layer of the multi-layer coverlay.

2. Description of Related Art

Photosensitive coverlay compositions are discussed broadly in U.S. Pat. No. 5,536,620 to Dueber et al. In many coverlay applications, flame retardancy can be important. Although halogenated materials have been used to provide flame retardancy to coverlays, environmental concerns have increasingly pressured manufacturers to make halogen-free flame retardant coverlay materials. Phosphorus is know to provide flame retardancy, but phosphorus can be problematic, e.g., cause undesirable phosphorus "bleed" and/or poor flexibility.

SUMMARY

The present invention is directed to phosphorus containing flame retardant, photoimagable, multi-layer compositions, having comparatively little, if any, halogen. The compositions of the present invention are generally useful as coverlay materials in flexible electronic circuitry packages. The compositions of the present invention have at least a top layer and a bottom layer.

The top layer has a thickness from 1 to 75 microns and comprises a binder having phosphorus moieties and a photo-initiator having phosphorus moieties. The top layer binder having phosphorus moieties can comprise a polymer, oligomer, monomer or any organic suitable for photoimageable coverlay type applications. The top layer comprises: i. phosphorus in a range from 2 to 10 weight percent; ii. photo-initiator in a range from 2 and 18 weight percent; and iii. top layer binder in an amount from 20 to 70 weight percent.

The bottom layer of the present invention comprises a binder which is the same as or different from the top layer binder and optionally comprises phosphorus moieties. The bottom layer binder having can comprise a polymer, oligomer, monomer or any organic suitable for photoimageable coverlay type applications. The bottom layer also comprises photo-initiator optionally having at least one phosphorus moiety. The bottom layer comprises phosphorus, if any, in an amount less than or equal to 4 weight percent. The bottom layer also has a thickness from 1 to 75 microns. Generally speaking, the total thickness of the multilayer coverlay composition is in a range from 2 to 150 microns.

DETAILED DESCRIPTION OF THE PREFERRED EMBODIMENT(S)

The present invention is directed to multi-layer compositions useful as coverlay materials for protecting fine line circuitry found on flexible substrates. The multi-layer compositions of the present invention have: i. at least one layer comprising photo-active (i.e., light-active) constituents, adapted for use in photolithographic processing or the like; and ii. at least one layer providing flame retardancy without requiring conventional amounts of halogen based material, i.e., the amount of halogen is equal to or less than 10,000, 5000, 1000, 500, 100, 50, 25, 10, 5, 2 or 1 ppm (parts per million) based upon weight of the flame retardant layer.

In one embodiment, the flame retardant photoimagable compositions of the present invention have at least two layers: i. a flame retardant layer (a top layer); and ii. a bonding layer (a bottom layer). The top layer binder and the bottom layer binder can each comprise a polymer, oligomer, monomer or any organic suitable for photoimageable coverlay type applications. In one embodiment, the binder (initially or ultimately) comprises a three dimensional polymer network, where at least 50 weight percent of each polymer network is an acrylic, epoxy, or epoxy modified acrylic type polymer, and where the bottom layer comprises at least 0.2 weight percent phosphorus.

In another embodiment, the top layer photo-initiator is covalently bonded to the top layer binder layer due to a chemical reaction involving an unsaturated double bond moiety, a carboxylic acid moiety, an acid moiety or a hydroxyl moiety. The top layer photo-initiator can be a phosphine oxide or acrylphosphine oxide derivative.

In one embodiment, the top layer photo-initiator comprises at least one of the following chemical structures:

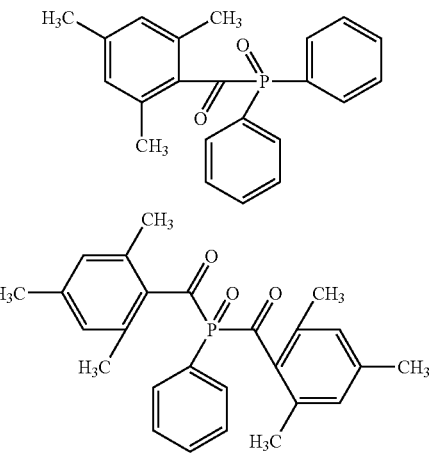

The compositions of the present invention can be crosslinked, such as, by use of a thermal crosslinking agent, e.g., a blocked or unblocked isocyanate crosslinking agent.

In one embodiment, at least one layer comprises a filler having an average particle size from 5 nanometers to 10,000 nanometers. Suitable fillers can be selected from a group consisting of aluminum hydroxide, magnesium hydroxide, zinc borate, micro crystalline cellulose, micro crystalline silicas, clays, alumina, bentonite, kalonites, attapultites, montmorillonites, silicon oxide, titanium oxide, carbon black, zinc oxide, melamine polyphosphate, melamine cyanurate, and ammonium polyphosphate.

Optionally, at least one layer comprises an adhesion promoter. Useful adhesion promoters include 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol and mercaptobenzimidazole.

Optionally either or both the top layer and bottom layer is flame retardant according to UL 94 Thin Material Vertical Burning Test 94VTM-0, UL 94 Thin Material Vertical Burning Test 94VTM-1 or UL 94 Thin Material Vertical Burning Test 94VTM-2.

The compositions of the present invention can comprise, in a top layer, phosphorus in an amount between, and including, any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8, 6.0, 6.2, 6.4, 6.6, 6.8, 7.0, 7.2, 7.4, 7.6, 7.8, 8.0, 8.2, 8.4, 8.6, 8.8, 9.0, 9.2, 9.4, 9.6, 9.8, and 10.0 weight percent.

The compositions of the present invention can typically comprise, in a bottom layer, phosphorus in an amount between, and including, any two of the following numbers, 0.0, 0.2, 0.4, 0.6, 0.8, 1.0, 1.2, 1.4, 1.6, 1.8, 2.0, 2.2, 2.4, 2.6, 2.8, 3.0, 3.2, 3.4, 3.6, 3.8, and 4.0 weight percent.

In one embodiment of the present invention, the multi-layer coverlay composition is placed over one or more circuit traces as a dry sheet and vacuum-pressed, and/or roll-pressed, thereby bonding the coverlay onto the circuit traces. Coverlay passageways can be formed by any conventional or non-conventional photo imaging process.

The photo imaging of at least one layer of the multi-layer coverlay can be accomplished by applying electromagnetic radiation through a pattern (commonly called a photo mask), so the radiation exposes only certain pre-defined portions of the photoimageable layer(s) of the coverlay. The exposed portions will typically have much lower aqueous carbonate solubility properties than the remaining unexposed portions, due at least in part to crosslinking, chain extension, and/or other photo-chemical reactions in the photo sensitive coverlay.

Thereafter, the coverlay can be subjected to an aqueous carbonate based removal process or the like. The solubility differential between the exposed and unexposed portions (arising from photo imaging) will generally cause the unexposed portions of the coverlay to swell and dissolve (or otherwise be removed). As portions of the coverlay are removed, passageways (through the coverlay) can be formed, and then additional curing step is applied to yield a thermally cross-linked network. Subsequently, these passageways are typically filled with metal, via a metal deposition chemistry and process.

Generally speaking, the coverlay materials of the present invention employ the use of phosphorus containing monomers (and/or phosphorus containing oligomer materials) with a phosphorus containing photo-initiator. Typically, the phosphorus-containing monomer (or oligomer) is an acrylate. The compositions of the present invention typically comprise phosphorus in a top layer in an amount between (and optionally including) any two of the following numbers 2.0, 2.2, 2.4, 2.6, 2.8, 3.0, 3.2, 3.4, 3.6, 3.8, 4.0, 4.2, 4.4, 4.6, 4.8, 5.0, 5.2, 5.4, 5.6, 5.8, 6.0, 6.2, 6.4, 6.6, 6.8, 7.0, 7.2, 7.4, 7.6, 7.8, 8.0, 8.2, 8.4, 8.6, 8.8, 9.0, 9.2, 9.4, 9.6, 9.8, and 10.0 weight percent and can typically comprise phosphorus in the bottom layer in an amount between (and optionally including) any two of the following numbers, 0.0, 0.2, 0.4, 0.6, 0.8, 1.0, 1.2, 1.4, 1.6, 1.8, 2.0, 2.2, 2.4, 2.6, 2.8, 3.0, 3.2, 3.4, 3.6, 3.8, and 4.0 weight percent.

In one embodiment of the present invention, a two-layer photoimagable coverlay composition is made having a total thickness of about 150 microns. The coverlay compositions of the present invention can have a thickness, either in the top layer or in the bottom layer of between (and optionally including) any two of the following numbers, 1, 3, 5, 10, 15, 20, 25, 30, 35, 40, 45, 50, 55, 60, 65, 70 and 75 microns. One range of possible total thicknesses for these coverlays is from about 2 to 150 microns. In other embodiments, the total thicknesses of the coverlays can range from about 12 microns to 50 microns.

In one embodiment of the present invention, a two-layer coverlay composition has a top layer with an amount of phosphorus that is the same or different from the amount of phosphorus in a bottom layer. In one such embodiment, the amount of phosphorus in the top layer is more than 5,10, 15, 20, 35, 30, 40, 50, 75, 100, 150, 200 percent greater than the amount in the bottom layer, resulting in a top layer with a higher level of flame retardancy, relative to the bottom layer. In this way, the bottom layer (in contact with the circuitry) has little, if any, phosphorus that might interfere with desired physical properties of the bottom layer, such as, flexibility and bond strength, while the overall coverlay composition can be sufficiently flame retardant to meet industry requirements, due to the top layer comprising relatively high levels of phosphorus.

In one embodiment, the combination of phosphorus-containing monomers (typically acrylates) and phosphorus-containing photo-initiators are polymerized into a polymer network. Actinic light radiation can be used to induce free radicals, which in turn can promote polymerization. Alternatively or in addition, heat can be used to induce and/or drive free radical polymerization. Such polymerization can cause the phosphorus to be fixed into a three-dimensional polymer network, thereby providing improved flexibility while also providing excellent flame retardancy.

As used herein, the term "unsaturated phosphorus-containing monomer" is used to describe any acrylate monomer or acrylate oligomer (or acrylate polymer formed from either an acrylate monomer or acrylate oligomer or both) having at least one ethylenical double bond and having at least one atom of phosphorus. Typically, the compositions of the present invention can comprise phosphorus containing acrylates in an amount between (and optionally including) any two of the following numbers 20, 25, 30, 35, 40, 45, 50, 55, 60, 65 and 70 weight percent of the phosphorus containing composition. For example, an ester based polymer precursor derived from a phosphate type compound can be prepared from phosphoric acid, or phosphoric acid derivatives, and alcohol or alcohol based derivatives. In addition, urethane acrylates and epoxy acrylates can be prepared from hydroxyl moieties of a phosphorus containing precursor material, where the precursor material can be based upon phosphoric acid, phosphine oxide or phosphinates.

Some phosphorus-containing monomers include, but are not limited to, commercially available V-3PA® (manufactured by Osaka Organic Chemical), MR-260® (manufactured by Daihachi Chemical), PM-2® and PM-21® (manufactured by Nihon Kayaku), RAYLOK 1721® and RAYLOK 1722® (manufactured by Surface Specialties). The amount of acrylate functionality containing within the phosphorus-containing monomer can impact the flexibility of cured coverlay. In general, lower concentrations are generally preferred such as the concentration found using RAYLOK®1722 (where the molecular weight is about 1500). Higher concentrations of acrylate functionality can be used such as monomers like PM-2® (where the molecular weight is about 166) and V-3PA® (where the molecular weight is about 130). However where higher concentrations of acrylate functionality are used typically other flexible monomers, like urethane acrylate oligomers, are also used so that good flexibility of the final coverlay is maintained.

As used here, the term "phosphorus containing photo-initiator" is intended to mean a photo-initiator containing the phosphorus atom in its structure. In one embodiment, acylphosphine oxide photo-initiator is used as a 'alpha-cleavage' photo-initiator creating two free radicals upon irradiation and initiating free radical polymerization. In another embodiment, the phosphorus moiety of the phosphorus-containing photo-initiator is attached to the end of the photo-initiator compound to aid in polymerization with other components.

Examples of useful phosphorus-containing photo-initiators include, but are not limited to, LUCIRIN TPO® and LUCIRIN TPO-L® and IRGACURE 819®. LUCIRIN TPO® and LUCIRIN TPO-L® are monoacylphosphine oxides. IRGACURE 819®, and its product family are bisacylphosphine oxides. In general, monoacylphosphine oxides can be useful due to their higher phosphorus content compared to bisacylphosphine oxides.

In one embodiment of the present invention, a phosphorus containing photo-initiator based on acylphosphine oxide can be used to initiate free radical polymerization via unsaturated double bonds found in a phosphorus containing acrylic monomer (or unsaturated phosphorous containing oligomer). The composition formed by this reaction can be described as a three-dimensional polymer network where phosphorus is incorporated into the network. In such embodiments, the phosphorus is incorporated into the polymer matrix from two sources, namely the unsaturated phosphorus-containing acrylate component and the phosphorus-containing photo-initiator component.

By introducing phosphorus with both these components, the phosphorus level can generally be more easily increased to relatively high levels, allowing for a coverlay material that is flame-retardant (with little, if any, use of halogenated materials), while still maintaining a variety of other beneficial physical properties such as good flexibility.

In another embodiment of the present invention, derivatives of phosphine oxides (including phosphinates and phosphates) are used. Such precursor materials can contain chemically reactive hydroxyl end groups that can be incorporated into a polymer matrix by reacting with a reactive agent, such as, a blocked isocyanate.

Phosphorus can be fixed into a polymer matrix of the present invention either through physical entanglement with the other components or by direct connection via chemical bonding. In another embodiment, alkaline developable resins containing chemically reactive carboxylic acid bond sites can also be used. In one instance, unsaturated double bonds positioned on polymer side chains can be useful in aiding polymerization of the binder and phosphorus-containing materials. In another instance, chemically reactive hydroxyl groups in the polymer binder can be used to aid in chemically reacting with a thermal crosslinking agent, e.g., a blocked isocyanates, particularly during thermal curing.

Useful derivatives of phosphine oxides include, but are not limited to, 1,4-cyclooctylenephosphonyl-1,4-benzene diol, 9-hydroxy-10-(2,5-dihydroxyphenyl)-9-oxo-10-phosphaphenanthorene-10-oxide, n-butyl-bis (3-hydroxypropyl) phosphine oxide, tris (3-hydroxypropyl) phosphine oxide, and 2-(9,10-dihydro-9-oxa-10-oxide-10-phosphananthrene-10-yl) methyl succinic acid bis-(2-hydroxyethyl)-ester.

In one embodiment of the present invention, the phosphorus-containing photo-initiator can be represented by the following formula,

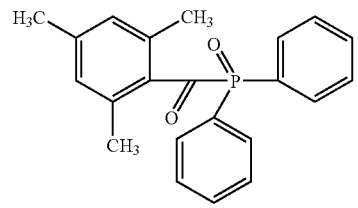

In another embodiment, the phosphorus-containing photo-initiator can be represented by the following formula,

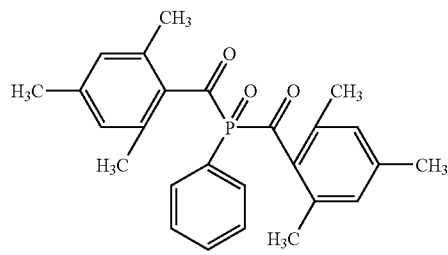

In one embodiment of the present invention a polymer binder (or oligomers of at least two repeating monomer units) having unsaturated double bonds, reactive carboxylic acid groups, or reactive hydroxyl end groups can be used. In general, reactive groups located on the polymer binders of the present invention can allow these polymers to react (or network) more completely with a phosphorus-containing monomer/oligomer and phosphorus-containing photo-initiator. In such embodiments, the phosphorus-containing monomers of the present invention can be effectively connected into the polymer network with chemical bonds. In general, carboxylic acid functionality can impart 'alkaline developability' (which can be desirable to many end-users) and hydroxyl end groups can act as an additional reaction site for thermal crosslinking agents including isocyanates.

In one embodiment of the present invention, acrylic co-polymers having any of these features can be particularly useful. Some of these acrylic co-polymers include, but are not limited to, glycidyl(meth)acrylate derivatives reacted with acid-containing acrylic co-polymer, and methacryloyl ethyl isocyanate reacted with hydroxyethyl acrylate (HEA) or 2-hydroxyethyl methacrylate (HEMA). (Meth)acrylic acid, and other acid containing (meth)acrylates (and other copolymerized acid containing materials) can also be useful. In another embodiment, modified epoxy resin prepared using a 2-step reaction (a reaction of epoxy resin and (meth)acrylic acid followed by a reaction between the resultant hydroxyl group and an acid anhydride) can also be a suitable polymer binder.

Photosensitive Compositions

In many embodiments of the present invention, the compositions further comprise additional components. These components can be catalysts, adhesion promoters, other non-halogen flame retardant additives, other photo-initiators and the like. These components can be used to render the compositions reactive to thermal and/or radiant energy thereby making the compositions useful in a variety of photoimagable coverlay applications.

"Photo-active," which is synonymous with "photosensitive," describes a material that changes its chemical or physical nature, or causes such a change, upon exposure to actinic radiation, in such a way that the change is formed directly. Examples include an image, or a precursor (a latent image is formed which upon further treatment produces the desired change). Photo-active components can include, but are not limited to, photo-initiators, photo-sensitizers, photosolubilizers, photodesensitizer, photoinhibitor, phototackifier, photodetackifier, a component that is photodegradable, photochromic, photoreducible, photo-oxidizable, photoadhesive, photoreleaseable, photomagnetic, photodemagnetic, photoconductive, photoinsulative, combinations thereof, and materials that change refractive index upon exposure to actinic radiation. Such photosensitive compositions of this invention include:

(i) a polymerizable monomer, and (ii) an initiating system activatable by actinic radiation.

"Thermally active" describes a material that changes its chemical or physical nature (or causes such a change) when its temperature is raised or when a substance is added or removed. Illustrative of such a photo active or thermally active component is a material which cyclizes, dimerizes, polymerizes, cross-links, generates a free radical, generates an ionic species or dissociates upon exposure to actinic radiation or when it is heated.

In one embodiment, the phosphorus compounds of the present invention are useful as components of photosensitive systems and particularly in photoimaging systems such as those described in "Light-Sensitive Systems: Chemistry and Application of Nonsilver Halide Photographic Processes" by J. Kosar, John Wiley & Sons, Inc., 1965 and more recently in "Imaging Processes And Materials—Neblette's Eighth Edition," edited by J. Sturge, V. Walworth and A. Shepp, Van Nostrand Reinhold, 1989. In such systems, actinic radiation impinges on a material containing a photoactive component to induce a physical or chemical change in that material. A useful image, or latent image, can be processed and produced. Typically actinic radiation useful for imaging is light ranging from the near ultraviolet through the visible spectral regions, but in some instances may also include infrared, deep-ultraviolet, X-ray and electron beam radiation.

Upon exposure to actinic radiation, the photo active component generally acts to change the Theological state, the solubility, the surface characteristics, refractive index, the color, the electromagnetic characteristics and/or other such physical or chemical characteristics of the photosensitive composition, such as is described in the Neblette's publication identified above.

The photosensitive compositions of this invention can be used in the form of a supported film or layer, although unsupported solid objects may also be prepared. The photosensitive composition can generally be applied to a suitable substrate to form a continuous film or layer thereon which can then be exposed to actinic radiation to form an image directly (or a latent image).

Alternatively, the supported layer may be uniformly exposed to actinic radiation to cure or harden the layer, particularly when the photosensitive composition is applied either in the form of a continuous or patterned layer, such as, a protective finish, a paint or ink. Any conventional source of actinic radiation may be used including arc, discharge, and incandescent lamps as well as lasers, X-ray and electron beam units. The layer may be applied as a solution and dried to a solid layer, using any conventional or non-conventional coating or printing process. Alternatively, the layer or film may be applied by laminating a supported solid photosensitive layer to the substrate and then optionally removing the support.

In some reversal imaging processes, the treatment step can be used to complete the formation of the latent image before or during development. Such systems include photopolymer systems, e.g., as disclosed in U.S. Pat. No. 4,198,242 to Pazos or U.S. Pat. No. 4,477,556 to Dueber et al., containing a photoinhibitor where imaging exposure generates an inhibitor in the exposed areas of the layer and a subsequent uniform exposure to actinic radiation, or in some instances uniformly heated, generates a latent image in the complimentary areas free of photogenerated inhibitor. Such reversal systems also include photodesensitizable systems, e.g., as disclosed in Roos U.S. Pat. No. 3,778,270, wherein, in the exposed areas, a component required for image or latent image formation is degraded or desensitized to an inactive form and the component in the unexposed areas is developed into an image or latent image by subsequent treatment with a reagent.

Illustrations of such photosensitive systems are described in Chapter 7, "Polymer Imaging" by A. B. Cohen and P. Walker in Neblette's supra, pages 226-262, in which photocrosslinking, photodimerization, photocyclization, photosolubilization, and both ionic and free radical photopolymerization, as well as electrostatic photopolymer imaging and solid imaging are discussed. In Chapter 8, "Low Amplification Imaging Systems" by R. Dessauer and C. E. Looney, pages 263-278, imaging systems discussed include color forming free radical, diazo, and vesicular systems, photochromism, phototackification and photodetackification as well as thermal and photothermal systems.

Photopolymerizable Compositions

In one embodiment, the coverlay compositions of the present invention can be particularly useful as photopolymerizable compositions. In such systems, the phosphorus-containing monomer (or oligomer) can be partially reacted or crosslinked into the polymer network to impart other desirable physical and chemical characteristics to both the exposed and unexposed portions of a photopolymerizable composition. In one embodiment, exposure to actinic radiation can induce the photo-initiator system to begin a chain-propagated polymerization of the monomeric/oligomeric materials via a step-growth mechanism, or by a free radical addition polymerization reaction.

While many photopolymerizable mechanisms can be contemplated, the compositions and processes of the present invention can be described in the more general context of a free radical initiation and addition polymerization of monomers having one or more terminal ethylenically unsaturated groups. In this context the photo-initiator systems of the present invention, when exposed to actinic radiation, can act as a source of free radicals (the free radicals being needed to initiate polymerization of the monomer component).

In one embodiment of the present invention, acylphosphine oxide photo-initiator (such as LUCIRIN® TPO, TPO-L, IRGACURE®819, or combinations of these) can posses the proper UV absorption characteristic while more generally known photo-sensitizers may not typically absorb necessary portions of the radiation spectra. Thus, the effect described above can in many cases minimize the amount of non-phosphorus initiator that needs to be used in the total photo-initiator system (or package). In a broader sense, the term "photo active" can refer to any or all the essential materials needed for photopolymerization (i.e., the photo initiating system and the monomer). Photopolymerizable compositions can contain mono- or multi-functional phosphorus-containing acrylate/methacrylate monomer/oligomer as well as non-phosphorus acrylate/methacrylate monomer/oligomer if desired.

Additional Polymerizable Monomers

Other suitable monomers useful as a co-monomer/oligomer in the compositions of the present invention include, but are not limited to the following, t-butyl acrylate, 1,5-pentanediol diacrylate, N,N'-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers/oligomers is alkylene or a polyalkylene glycol diacrylates prepared from an alkylene glycol of 2 to 15 carbons or a polyalkylene ether glycol of 1 to 10 ether linkages, and those disclosed in U.S. Pat. No. 2,927,024, e.g., those having a plurality of additional polymerizable ethylenic linkages particularly when present as terminal linkages. Preferred are those wherein at least one and preferably most of such linkages are conjugated with a double bonded carbon, including carbon double bonded to carbon and to such hetero atoms as nitrogen, oxygen and sulfur. Also preferred are such materials wherein the ethylenically unsaturated groups, especially the vinylidene groups, are conjugated with ester or amide structures.

A particularly preferred class of monomers/oligomers can be hexamethylene glycol diacrylate, ethoxlated 1,6-hexanediol diacrylate, acrylated aromatic/aliphatic urethane oligomer, bis-phenol A ethoxylated (10-30 mole) diacrylate/dimethacrylate, polyethoxylated diacrylate/dimethacrylate, polypropoxylated diacrylate/dimethacrylate, polyester modified Bis-phenol A di-acrylate/di-methacrylate, triethylene glycol diacrylate, tripropylene glycol diacrylate, pentaerythritol triacrylate, trimethylolpropane triacrylate, polyoxyethylated trimethylolpropane triacrylate, Additional Suitable Photo-initiators Additional photo-initiators can be used in addition to the phosphorus-containing photo-initiators described above. These photo-initiators can have one or more compounds that directly furnish free-radicals when activated by actinic radiation. The total amount of photo-initiator also may contain a sensitizer that is activated by the actinic radiation, causing the compound to furnish the free-radicals.

Photo-initiator systems of the present invention can contain a photo-sensitizer that extends spectral response into the near ultraviolet, visible, and near infrared spectral regions. A large number of free-radical generating compounds, including redox systems such as Rose Bengal/2-dibutylaminethanol, may be selected to advantage. Photoreducible dyes and reducing agents such as those disclosed in U.S. Pat. Nos.: 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos.; 3,427,161; 3,479,185; 3,549,367; 4,311,783; 4,622,286; and 3,784,557 can be used as initiators. Other initiators are dye-borate complexes disclosed in U.S. Pat. No. 4,772,541. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487. Similarly, the cyclohexadienone compounds of U.S. Pat. No. No. 4,341,860 can be useful as initiators.

Reacting or Crosslinking Agents

When the photopolymerizable composition is to be used as a permanent coating, such as a solder mask, a chemically or thermally activated reacting or crosslinking agent may be incorporated to improve high temperature characteristics, chemical resistance or other mechanical or chemical properties. Suitable reacting or crosslinking agents include those disclosed in U.S. Pat. No. 4,621,043 to Gervay, and U.S. Pat. No. 4,438,189 to Geissler et al., such as melamines, ureas, benzoguanamines, and the like.

Examples of suitable reacting or crosslinking compounds include: N-methylol compounds of organic carboxamides such as N,N'-dimethylolurea, N,N'-dimethyloloxamide, N,N'-dimethylolmalonamide, N,N'-dimethylolsuccinimide, N,N'-dimethylolsebacamide, N,N',N"-trimethylolcitramide, 1,3-dimethylolimidazolidine-2-one, 1,3-dimethylol-4,5-dihydroxyimidazidine-2-one, 1,3-dimethylolperhydropyrimidine-2-one, trimethylolmelamine, tetramethylolmelamine, hexamethylolmelamine, 1,3-dimethylol-5-methylperhydro-1,3,5-triazine-2-one, 1,3-dimethylol-5-allylperhydro-1,3,5-triazine-2-one, 1,3-dimethylol-5-butylperhydro-1,3,5-triazine-2-one, 1,2-bis-[1,3-dimethylolperhydro-1,3,5-triazine-2-one-5-ylethane, tetramethylolhydrazine dicarboxamide, N,N'-dimethylolterephthalamide, N,Nl-dimethylolbenzene-1,3-disulfonamide and tetramethylolglycoluril; and C-methylol compounds of phenols, phenol-ethers and aromatic hydrocarbons 2,4,6-trimethylolphenol, 2,6-dimethylol-4-methyloanisole, 2,6-dimethylol-4-methylphenol, 1,3-dimethylol-4,6-diisopropylbenzene, 2,2-bis-(4-hydroxy-3,5-dimethylolphenyl)propane, and 3,3'-dimethylol-4,4'-dihydroxydiphenyl sulfone.

Instead of the aforementioned methylol compounds, it is also possible to use, for example, the corresponding methyl, ethyl or butyl ethers, or esters of acetic acid or propionic acid. Suitable examples include: 4,4'-bismethoxymethyidiphenyl ether, tris-methoxymethyl-diphenyl ether, tetrakis-methoxymethyl hydrazinedicarboxamide, tetrakis-methoxymethyl-glycoluril, tetrakis-hydroxyethoxymethylglycoluril, bis-acetoxymethyidiphenyl ether, hexamethoxymethyl-melamine. In one embodiment, a preferred crosslinking agent of this class is hexamethoxymethyl melamine.

Other useful reacting or crosslinking agents are compounds containing two or more epoxy groups such as the bis-epoxides disclosed in U.S. Pat. No. 4,485,166 to Herwig et al. Suitable bis-epoxides include bis-glycidal ethers of dihydric alcohols and phenols such as bisphenol A, of polyethylene glycol and polypropylene glycol ethers of bisphenol A, of butane-1,4-diol, hexane-1,6-diol, polyethylene glycol, propylene glycol or polytetrahydrofurane. Bis-glycidyl ethers of trihydric alcohols, such as glycerol can also be used. Preferred reacting or crosslinking agents of this class are 2,2-bis-(4-glycidoxy-phenyl)-propane and 2,2-bis-(4-epoxy-ethoxy-phenyl)-propane.

Preferred reacting or crosslinking agents of this invention are blocked polyisocyanates. Upon heating a blocked polyisocyanate, blocking groups split off to yield a free reactive polyisocyanate. The free reacting polyisocynate can be easily reacted with a hydroxyl group, especially with a primary hydroxyl group to form a urethane linkage. Useful polyisocyanates in the present invention include toluene diisocyanate, isophorone diisocyanate, 1,4-naphthalene diisocyanate, 1,6-hexamethylene diisocyanate, tetramethyl xylene diisocyanate, bis (4-isocyanatocyclohexyl) methane and the like. Useful blocking groups are derived from caprolactam; diethyl malonate; alcohols; phenols; oximes, e.g., methyl ethyl ketoxime; and the like.

Adhesion Promoters

When the photopolymerizable composition is to be attached to a metal surface, a heterocyclic or mercaptan compound may be added to improve adhesion of the composition to a metal.

Suitable adhesion promoters include heterocyclics such as those disclosed in U.S. Pat. No. 3,622,334 to Hurley et al., U.S. Pat. No. 3,645,772 to Jones, and U.S. Pat. No. 4,710,262 to Weed. Examples of useful adhesion promoters include benzotriazole, 5-chloro-benzotriazole, 1-chloro-benzotriazole, 1-carboxy-benzotriazole, 1-hydroxy-benzotriazole, 1,2-napthotriazole, benzimidazole, mercaptobenzimidazole, 5-nitro-2-mercaptobenimidazole, 5-amino-2-mercyptobenzimidazole, 2-amino-benzimidazole, 5-methyl-benzimidazole, 4,5-diphenyl-benzimidazole, 2-guanadino-benzimidazole, benzothiazole, 2-amino-6-methyl-benzothiazole, 2-mercaptobenzothiazole, 2-methyl-benzothiazole, benzoxazole, 2-mercaptobenzoxazole, 2-mercaptothiazoline, benzotriazole, 3-amino-1,2,4-triazole, 1H-1,2,4-triazole-3-thiol, 5-amino-1,3,4-thiodiazole-2-thiol, 4-mercapto-1H-pyrazolo [3,4-d]pyrimidine, 4-hydroxy-pyrazolo[3,4-d]pyrimidene, 5-amino-tetrazole monohydrate, tolutriazole, 1-phenyl-3-mercapototetrazole, 2-amino-thiazole, and thio-benzanilide.

Preferred adhesion promoters for use in photoresists and solder masks include 2-amino-5-mercaptothiophene, 5-amino-1,3,4-thiodiazole-2-thiol, benzotriazole, 5-chloro-benzotriazole, 1-chloro-benzotriazole, 1carboxy-benzotriazole, 1-hydroxy-benzotriazole, 2-mercaptobenzoxazole, 1H-1,2,4-triazole-3-thiol, and mercaptobenzimidazole.

Polymeric Modifiers

The photopolymerizable composition may (optionally) contain additional polymeric binders to modify adhesion, flexibility, hardness, oxygen permeability, moisture sensitivity and other mechanical or chemical properties required during its processing or end use. Such modifiers can be particularly useful in adjusting room temperature creep viscosity, so the coverlay compositions of the present invention can be stored in a rollstock form, without unwanted creep or deformation.

Suitable polymeric binders which can be used in combination with the binder of this invention include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; polyvinyl pyrrolidone and copolymers, e.g., poly(vinyl pyrrolidone/vinyl acetate) saturated and unsaturated polyurethanes; synthetic rubbers, e.g., butadiene/acrylonitrile, acrylonitrile/butadiene/styrene, methacrylate/acrylonitrile/butadiene/styrene copolymers, and styrene/butadiene/styrene, styrene/isoprene/styrene block copolymers; high molecular weight polyethylene oxides of polyglycols having average molecular weights from about 4,000 to 1,000,000; copolyesters, e.g., those prepared from the reaction product of a polymethylene glycol of the formula $HO(CH_2)_nOH$ where n is a whole number 2 to 10 inclusive, and (1) hexahydroterephthalic, sebacic and terephthalic acids,
(2) terephthalic, isophthalic and sebacic acids,
(3) terephthalic and sebacic acids,
(4) terephthalic and isophthalic acids,
(5) mixtures of copolyesters prepared from said glycols
(6) terephthalic, isophthalic and sebacic acids
(7) terephthalic, isophthalic, sebacic and adipic acid; nylons or polyamides, e.g., N-methoxymethyl polyhexamethylene adipamide; cellulose esters, cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development the photosensitive layer will be removed in portions which are not exposed to radiation but will be substantially unaffected during development by a liquid such as wholly aqueous solutions containing 1% sodium carbonate by weight. A specific, preferred class of polymeric binder modifiers are polyvinyl pyrrolidone polymers and copolymers thereof, and amphoteric polymers and copolymers thereof.

Plasticizers

The photopolymerizable compositions may also contain a plasticizer to modify adhesion, flexibility, hardness, solubility, and other mechanical or chemical properties required during its processing or end use. However, a dedicated plasticizer may not be necessary, particularly if plasticizer properties are obtained from other ingredients formulated into the coverlay for other purposes or functions.

Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropyinaphthalene, poly(propylene glycol), glyceryl tributyrate, diethyl adipate, diethyl sebacate, dibutyl suberate, dioctyl phthalate, tricresyl phosphate, tributyl phosphate, tris(2-ethylhexyl) phosphate.

Fillers

The photopolymerizable compositions may also contain suitable organic or inorganic fillers to improve flame retardant, thermal resistance, physical properties and the thixotropic nature of these compositions. For example, $Al(OH)_3$ and $Mg(OH)_2$ are well-known inorganic flame retardants. Zinc borate is another class of inorganic flame retardant fillers. Additional fillers useful in the present invention are microcrystalline thickeners as disclosed in U.S. Pat. No. 3,754,920, e.g., microcrystalline cellulose, microcrystalline silicas, clays, alumina, bentonite, kalonites, attapultites, and montmorillonites. Another class of fillers includes finely divided powders having a particle size of 5 nanometers to 50 microns, preferably 5 nanometers to 500 nanometers, as disclosed in U.S. Pat. No. 3,891,441, such as silicon oxide, titanium oxide, carbon black, zinc oxide, and other commercially available pigments.

Melamine polyphosphate, melamine cyanurate, ammonium polyphosphate, and some of organic phosphorus materials that cannot be dissolved in common organic solvent can be regarded as fillers in this invention.

Optional Components

Other compounds conventionally (or even non-conventionally) can be added to photosensitive compositions to modify the physical properties of the film for a particular use. Such components include: other polymeric binders, fillers, thermal stabilizers, hydrogen donors, thermal crosslinkers, optical brighteners, ultraviolet radiation materials, adhesion modifiers, coating aids, and release agents. The photo polymerizable compositions may contain other components such as thermal polymerization inhibitors, dyes and pigments, optical brighteners and the like to stabilize, color or otherwise enhance the composition.

Thermal polymerization inhibitors that can be used in the photo polymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

Coating Liquids

The photoimageable, permanent coating may be coated as a liquid onto the printed circuit substrate using any conventional coating process. The liquid may be a solution or a dispersion of the permanent coating composition wherein the solvent is removed sufficiently, after coating, to form a tack-free coverlay layer. The additional layer or layers are coated sequentially and dried. The liquids may be spray coated, roller-coated, spin-coated, screen-coated or printed as disclosed in the Coombs patent discussed above, in the DeForest patent discussed above, in U.S. Pat. No. 4,064,287 to Lipson et al., or in U.S. Pat. No.4,376,815 to Oddi et al. The liquid, typically as a solution, may also be curtain coated as disclosed in U.S. Pat. No. 4,230,793 to Losert et al. In the instance where printed circuits are manufactured on a continuous web of film substrate, permanent coating liquid may be coated by any conventional (or non-conventional) web coating process.

Photoimageable Coverlay Process

Photoimageable permanent coatings can be used as a solder mask to protect printed circuits during subsequent processing, primarily solder operations, and/or from environmental effects during use. Permanent coatings also are used as intermediate insulative layers, with or without development, in the manufacture of multilayer printed circuits.

In practice, the photoimageable multilayer coating composition, typically between 15 and 50 micrometers (0.6 and 2 mils) thick, is applied to a printed circuit substrate which typically is a printed circuit relief pattern on a substrate that is semi-rigid or flexible. The photoimageable coating compositions may be sequentially coated as liquids and dried between layers or may be applied as a pre-coated single layer or multilayer composition on a temporary support. The composition is applied to a printed circuit substrate with vacuum lamination. The applied photopolymerizable composition is then exposed to actinic radiation to harden or insolubilize exposed areas. Any unexposed areas are then completely removed typically with an alkaline, aqueous sodium or potassium carbonate developer solution which selectively dissolves, strips, or otherwise disperses the unexposed areas without adversely affecting the integrity or adhesion of the exposed areas. The developed permanent resist image is typically cured at 160° C. for 1 hour. After cure the circuit board has a cured permanent resist layer covering all areas except unexposed areas that have been removed by development. Electrical components are then connected via the openings in the solder mask via insertion into the through-holes or positioned on surface mount areas and soldered in place to form the packaged electrical component.

Permanent Coating Evaluation

Printed circuits must withstand a variety of tests that are dependent on the application of the circuits, which in turn governs the type of material used as the circuit substrate. A stringent application is for flexible printed circuits which require a fold or bend for a particular space requirement, such as a camera or video cassette recorder (VCR), and may require the capability of surviving multiple bends, such as in a computer disc drive. In some applications a flexible circuit is combined with a rigid circuit to form a flex-rigid multilayer printed circuit. The end use tests for flexible circuits focus on adhesion and the capability to withstand a single fold or multiple bends. The process and several tests that are used to support the examples in this application are described below.

A pre-formed, dry-film, photopolymerizable coating is applied, after removal of a removable cover sheet, e.g., polyethylene or polypropylene used to protect the permanent coating element during storage, to the pre-cleaned copper printed circuit surface of the substrate with a SMVL vacuum laminator. Although the laminate is typically exposed to actinic radiation through the temporary support film, in some instances, the temporary support may be removed before imaging to improve resolution and other such properties.

Typically, when a dry film is laminated without a liquid assist to a printed circuit substrate having a low circuit relief, measures must be taken to eliminate entrapped air, e.g., from around circuit lines. Entrapped air is eliminated by the vacuum lamination process described in U.S. Pat. No. 4,127,436 to Fiel, or may be eliminated by the grooved roll lamination process described in U.S. Pat. No. 4,071,367 to Collier et al. A Solder Mask Vacuum Laminator (SMVL) is useful in eliminating entrapped air, but this laminator is limited to atmospheric pressure lamination force after the evacuation cycle. If higher pressure is needed, the SMVL lamination can be followed by a hot press lamination, or alternatively a vacuum press can be used for the lamination.

Flammability (UL94 Test)

Specimens were tested in accordance with the UL 94 Thin Material Vertical Burning Test for classing resist coating materials as 94VTM-0, 94VTM-1 or 94VTM-2. The 94VTM-0 classification is the best rating, indicating significantly reduced flammability.

EXAMPLES

The advantages of the present invention are illustrated in the following examples. These examples are not intended to limit the scope of this invention. The compositions below are described in weight % for each ingredient used. The following glossary contains of list of names and abbreviations for each ingredient used:

| | |
|---|---|
| Lucirion ® TPO | Diphenyl 2,4,6-trimethyl benzylphosphine oxide from BASF |
| Irgacure ® 819 | Bis(2,4,6-trimethylbenzoyl)-phenyl Phosphine Oxide from Ciba Specialty Chem. |
| Raylok 1722 | Phosphorus containing Polyester acrylate Oligomer, Mw = 3000, Functionality = 2, P-content = 5% from Surface Specialty Chem. |
| Ebecryl ® 9119 | 75% by weight solids of urethane di-acrylate from Surface Specialty Chem. |
| Desmodur ® BL3175 | Hexamethylene diisocyanate based polyisocyanate blocked with methyl ethyl ketoxime and dissolved at 75% solids in ethyl acetate |
| 5-ATT | 5-amino-1,3,4-thiadiazole-2-thiol from Aldrich Chemical Co. |
| Basonyl ® Blue Green | Green dye from Crompton & Knowles Corp., Reading, PA |
| PO-4500 | n-Butyl-bis (3-hydroxypropyl) Phosphine Oxide from Nihon Kagaku |
| ADK STAB FP-700 | Oligomeric Phosphate from ADEKA |
| Reactive acrylic copolymer | MAA: 18%, HEMA: 5%, Reactive acrylate through epoxy linkage: 7%, Tg = 30 C, Mw = 80,000 |
| PVP-P90 | Polyvinylpyrrolidone from GAF Chem. |
| BF013S | Al(OH)3 from Nihon KeiKinzoku |

Example 1

Each coating solution was coated on 19 um Teijin G2 to have 25 um dried thickness. Dried coatings were laminated to have a two-layer 50 um total thickness film with various combinations. Coatings were vacuum laminated to a chemically cleaned Pyralux® TM with a solder mask vacuum laminator at 50° C. Time to clear (TTC) in 1% aqueous sodium carbonate (at 40° C.) was determined. The optimum exposure (that is required to obtain 7 steps in SST21 of polymer image) after development using a SST21 wedge photo mask was determined. This optimum exposure was used for EXAMPLES 1-3.

Samples were exposed, developed at 2 times the time to clear unexposed material, and developed samples were air dried and cured at 160° C. for one hour. The processed samples were tested with immersion in 10% sulfuric acid at 30° C. for 20 min. In this EXAMPLE the phosphorus content in the 'top layer' was 4.2% and in the 'bottom layer' was 2.5%.

Top Layer

| Ingredient | % by Weight |
|---|---|
| Reactive acrylic copolymer | 25.00 |
| PVP-K90 | 1.00 |
| Raylok 1722 | 56.00 |
| PO-4500 | 6.00 |
| Desmodur ® BL3175 | 4.83 |
| Lucirin ® TPO | 7.00 |
| Sevron Blue | 0.04 |
| 5-ATT | 0.13 |

Bottom Layer

| Ingredient | % by Weight |
|---|---|
| Reactive acrylic copolymer | 35.50 |
| PVP-K90 | 0.50 |
| Raylok 1722 | 30.00 |
| Ebecryl ® 9119 | 19.00 |
| PO-4500 | 3.00 |
| Desmodur ® BL3175 | 4.83 |
| Lucirin ® TPO | 7.00 |
| Sevron Blue | 0.04 |
| 5-ATT | 0.13 |

This sample passed bend/crease testing and acid resistance. Samples passed UL94VTM-0 flame retardant testing on 25 um Kapton®E.

Example 2

This EXAMPLE was prepared in accordance with the procedure of EXAMPLE 1. In this EXAMPLE the phosphorus content in the 'top layer' was 3.7% and in the 'bottom layer' was 2.3%. The ingredients used were changed as follows:

Top Layer

| Ingredient | % by Weight |
|---|---|
| Reactive acrylic copolymer | 23.00 |
| PVP-K90 | 1.00 |

-continued

| Ingredient | % by Weight |
|---|---|
| Raylok 1722 | 51.00 |
| PO-4500 | 4.43 |
| Desmodur ® BL3175 | 4.40 |
| Lucirin ® TPO | 6.00 |
| Sevron Blue | 0.04 |
| 5-ATT | 0.13 |
| BF013S | 10.00 |

Bottom Layer

| Ingredient | % by Weight |
|---|---|
| Reactive acrylic copolymer | 32.00 |
| PVP-K90 | 0.45 |
| Raylok 1722 | 27.00 |
| Ebecryl ® 9119 | 17.00 |
| PO-4500 | 2.70 |
| Desmodur ® BL3175 | 4.30 |
| Lucirin ® TPO | 6.39 |
| Sevron Blue | 0.04 |
| 5-ATT | 0.12 |
| BF013S | 10.00 |

This sample passed bend/crease testing and acid resistance. Samples passed UL94VTM-0 flame retardancy testing on 25 um Kapton®E.

Comparative Example 1

This COMPARATIVE EXAMPLE indicates the need for higher phosphorus content in a top layer. In this EXAMPLE the phosphorus content in the 'top layer' was 2.5% and in the 'bottom layer' was 4.2%.

Top Layer

| Ingredient | % by Weight |
|---|---|
| Reactive acrylic copolymer | 35.50 |
| PVP-K90 | 0.50 |
| Raylok 1722 | 30.00 |
| Ebecryl ® 9119 | 19.00 |
| PO-4500 | 3.00 |
| Desmodur ® BL3175 | 4.83 |
| Lucirin ® TPO | 7.00 |
| Sevron Blue | 0.04 |
| 5-ATT | 0.13 |

Bottom Layer

| Ingredient | % by Weight |
|---|---|
| Reactive acrylic copolymer | 25.00 |
| PVP-K90 | 1.00 |
| Raylok 1722 | 56.00 |
| PO-4500 | 6.00 |
| Desmodur ® BL3175 | 4.83 |

-continued

| Ingredient | % by Weight |
|---|---|
| Lucirin ® TPO | 7.00 |
| Sevron Blue | 0.04 |
| 5-ATT | 0.13 |

Sample failed Flame retardant testing while many other properties were acceptable.

Comparative Example 2

This COMPARATIVE EXAMPLE indicates the need for a higher phosphorus content in a top layer when total Phosphorus content of Coverlay is same. In this EXAMPLE, the phosphorus content was 3.4%.

Top Layer & Bottom Layer

| Ingredient | % by Weight |
|---|---|
| Reactive acrylic copolymer | 30.25 |
| PVP-K90 | 0.75 |
| Raylok 1722 | 43.00 |
| Ebecryl ® 9119 | 9.50 |
| PO-4500 | 4.50 |
| Desmodur ® BL3175 | 4.83 |
| Lucirin ® TPO | 7.00 |
| Sevron Blue | 0.04 |
| 5-ATT | 0.13 |

Sample failed Flame retardant testing while many other properties were acceptable.

Comparative Example 3

This COMPARATIVE EXAMPLE shows phosphorus compounds not chemically connected to the polymer network. In this EXAMPLE the phosphorus content in the 'top layer' was 4.2% and in the 'bottom layer' was 2.5%.

Top Layer

| Ingredient | % by Weight |
|---|---|
| Reactive acrylic copolymer | 27.00 |
| PVP-K90 | 1.00 |
| Raylok 1722 | 45.00 |
| ADKA STAB FP-700 | 15.00 |
| Desmodur ® BL3175 | 4.83 |
| Lucirin ® TPO | 7.00 |
| Sevron Blue | 0.04 |
| 5-ATT | 0.13 |

Bottom Layer

| Ingredient | % by Weight |
|---|---|
| Reactive acrylic copolymer | 35.50 |
| PVP-K90 | 0.50 |
| Raylok 1722 | 30.00 |
| Ebecryl ® 9119 | 19.00 |
| PO-4500 | 3.00 |
| Desmodur ® BL3175 | 4.83 |
| Lucirin ® TPO | 7.00 |
| Sevron Blue | 0.04 |
| 5-ATT | 0.13 |

Sample passed Flame retardant testing, but photo-performances of the sample were poor due to too much non-photoreactive phosphorus component being present in the formulation.

The above disclosure is not intended to be a limitation to the overall scope of this invention. The scope of the present invention is intended to be defined solely by the following claims.

What is claimed is:

1. A photosensitive, multilayer circuit coverlay composition comprising:
   a. a top layer comprising a top layer binder having phosphorus moieties and a top layer phosphine oxide or acrylphosphine oxide derivative photo-initiator, the top layer photo-initiator being covalently bonded to the top layer binder due to a chemical reaction involving an unsaturated double bond moiety, a carboxylic acid moiety, an acid moiety or a hydroxyl moiety, the top layer having a thickness from 1 to 75 microns and the top layer comprising: i. phosphorus in a range from 2 to 10 weight percent; ii. said photo-initiator in a range from 2 and 18 weight percent; and iii. said top layer binder in an amount from 20 to 70 weight percent, and
   b. a bottom layer comprising a bottom layer binder having phosphorus moieties and a bottom layer photo-initiator having at least one phosphorus moiety, the bottom layer comprising phosphorus in an amount less than or equal to 4 weight percent and at least 0.2 weight percent and the bottom layer having a thickness from 1 to 75 microns
   wherein the total thickness of the multilayer coverlay composition is in a range from 2 to 150 microns,
   wherein the amount of phosphorus in the top layer is more than 30 percent greater than the amount of phosphorus in the bottom layer,
   wherein the top layer binder and the bottom layer binder each comprise a three dimensional polymer network, the phosphorus in each said layer being fixed in each respective three dimensional network, each network being crosslinked due to a thermal crosslinking agent, and at least 50 weight percent of each polymer network being an acrylic, epoxy, or epoxy modified acrylic type polymer, and
   wherein the top layer and the bottom layer are both flame retardant according to UL 94 Thin Material Vertical Burning Test 94VTM-0, UL 94 Thin Material Vertical Burning Test 94VTM-1 or UL 94 Thin Material Vertical Burning Test 94VTM-2.

2. A composition in accordance with claim 1 wherein the top layer photo-initiator comprises at least one of the following chemical structures:

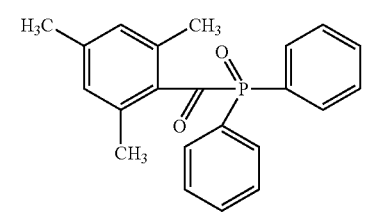

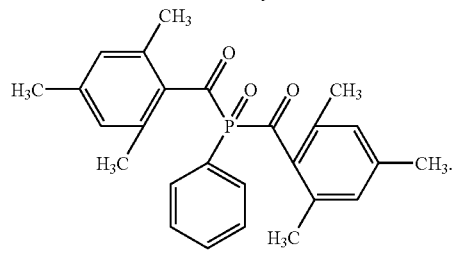

3. A composition in accordance with claim 1, wherein at least one layer comprises a filler having an average particle size from 5 nanometers to 10,000 nanometers, the filler selected from a group consisting of aluminum hydroxide, magnesium hydroxide, zinc borate, micro crystalline cellulose, micro crystalline silicas, clays, alumina, bentonite, kalonites, attapultites, montmorillonites, silicon oxide, titanium oxide, carbon black, zinc oxide, melamine polyphosphate, melamine cyanurate, and ammonium polyphosphate.

4. A composition in accordance with claim 1, wherein at least one layer further comprises an adhesion promoter, wherein the adhesion promoter is selected from a group consisting of 2-amino-5-mercaptothiophene, 5-amino-1,3,4-thiodiazole-2-thiol, benzotriazole, 5-chloro-benzotriazole, 1-chloro-benzotriazole, 1-carboxy-benzotriazole, 1-hydroxy-benzotriazole, 2-mercaptobenzoxazole, 1H-1,2,4-triazole-3-thiol and mercaptobenzimidazole.

* * * * *